United States Patent

Joyner

[11] Patent Number: 5,863,827
[45] Date of Patent: Jan. 26, 1999

[54] OXIDE DEGLAZE BEFORE SIDEWALL OXIDATION OF MESA OR TRENCH

[75] Inventor: Keith Joyner, Richardson, Tex.

[73] Assignee: Texas Instruments Incorporated, Dallas, Tex.

[21] Appl. No.: 868,086

[22] Filed: Jun. 3, 1997

[51] Int. Cl.⁶ .................................................. H01L 21/76
[52] U.S. Cl. ..................... 438/425; 438/424; 438/435; 448/DIG. 50
[58] Field of Search .................... 438/424, 425, 438/426, 427, 435, 437; 148/DIG. 50

[56] References Cited

U.S. PATENT DOCUMENTS

| | | | |
|---|---|---|---|
| 4,563,227 | 1/1986 | Sakai et al. | |
| 5,258,332 | 11/1993 | Horioka et al. | 438/424 |
| 5,578,518 | 11/1996 | Koike et al. | 438/424 |
| 5,719,085 | 2/1998 | Moon et al. | 438/424 |

*Primary Examiner*—Trung Dang
*Attorney, Agent, or Firm*—Jacqueline J. Garner; W. James Brady, III; Richard L. Donaldson

[57] ABSTRACT

A shallow trench isolation (STJ) (10) is used to isolate two active regions (12) from each other. The advantage of STI (10) is that the upper corners (14) are rounded. Rounding of the upper corners (14) is accomplished using an oxide deglaze prior to sidewall oxidation of the trench which undercuts the pad oxide (20) from the pad nitride (22). The allows the sidewall oxidation process to form a thicker oxide at upper corners (14) which in turn, rounds the corners. Rounded corners (14) minimum the electric field strength induced by the geometry. As a result, the Vt lowering that occurs in prior art STI structures is minimized and off-state leakage due to the inherent parasitic transistor at the upper corner is reduced.

17 Claims, 1 Drawing Sheet

OXIDE DEGLAZE BEFORE SIDEWALL OXIDATION OF MESA OR TRENCH

FIELD OF THE INVENTION

This invention generally relates to semiconductor processing and more specifically to sidewall oxidation of SOI mesas or bulk trenches.

BACKGROUND OF THE INVENTION

As CMOS device dimensions continue to shrink, the LOCOS Focal oxidation of silicon) isolation structure that has served the technology well into the submicron regime runs up against several fundamental limitations. The extension of the "bird's beak" taper into the active transistor areas becomes unavoidable as the maximum distance between active regions decreases. Reducing the distances between regions, in turn, also requires that the area available for growth of the isolating oxide must diminish as well. Unfortunately, field thinning effects limit the thickness of the oxide that can be grown in these small areas within an acceptable thermal budget and, therefore, the isolation capacity of the structure. In addition, lateral diffusion of the channel stop implants, particularly boron, and the associated narrow-width effects created become all the more significant in smaller device areas. The lack of planarity also creates problems, particularly as the sophistication of the interconnection scheme increases.

Shallow trench isolation is a possible replacement for LOCOS. Shallow trenches are formed in the isolation area. A hardmask consisting of a pad oxide layer is used for the trench etch. A pad nitride layer overlies the pad oxide and serves as a diffusion barrier and/or structural element. After the trench is formed, a sidewall oxidation is performed to fill the trench with oxide. A similar process is used for forming mesa isolation in SOI devices. However, the presence of the pad nitride over the pad oxide reduces the oxidation rate at the corner of the trench or mesa. The top corner of the SOI mesa or bulk trench has a lower Vt that the top surface. This is due to both two dimensional effects and a thinner gate dielectric at the corner. This causes a parasitic transistor formed at this corner to turn on before the main transistor, causing higher off state leakage. Therefore, there is a need for a mesa or trench isolation method that raises the Vt at the corner and reduces the electric field strength at the corner. In addition the thinner dielectric can cause gate oxide integrity degradation

SUMMARY OF THE INVENTION

A method for rounding the corner of trench or mesa isolation is disclosed herein. An oxide deglaze is used to recess the pad oxide beneath the pad nitride prior to sidewall oxidation of the trench or mesa. This reduces the corner sharpness of the trench and causes a thicker oxide to be formed at the corner of the trench or mesa. The Vt at the corner of the trench is increased and off state leakage due to a parasitic transistor at the corner is reduced.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with shallow trench isolation in CMOS devices. It will be apparent to those of ordinary skill in the art that the benefits of the invention may be utilized in other isolation structures and in other devices. For example, the invention is equally applicable to mesa isolation in SOI devices.

Figure 1:
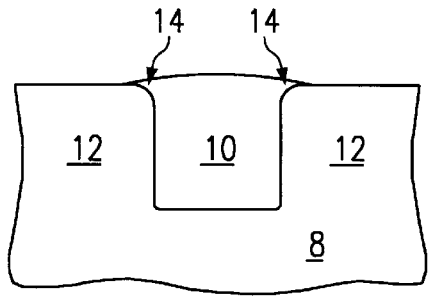
FIG. 1 is a cross-sectional diagram of shallow trench isolation according to the invention.

A shallow trench isolation (STI) 10 according to the invention is shown in FIG. 1. STI 10 is used to isolate two active regions 12 from each other. Transistors and other active device elements (not shown) may be located in active regions 12. STI 10 is filled with an oxide such as TEOS. The advantage of STI 10 is that the upper corners 14 are rounded. Rounding of the upper corners 14 minimizes the electric field strength induced by the geometry. As a result, the Vt lowering that occurs in prior art STI structures is minimized and off-state leakage due to the inherent parasitic transistor at the upper corner is reduced.

Figure 2A:
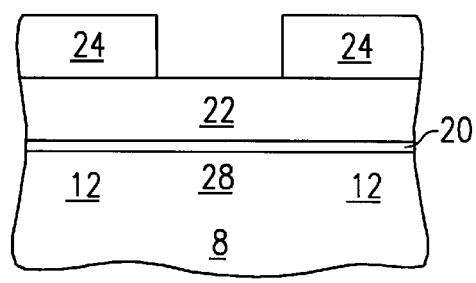
FIGS. 2A–E are cross-sectional diagrams of the shallow trench isolation of FIG. 1 at various stages of fabrication.

A method for forming STI 10 according to the invention will now be discussed in conjunction with FIGS. 2A–2E. Referring to FIG. 2A, a pad oxide 20 is grown in the surface of semiconductor body 8. Semiconductor body 8 may, for example, be a bulk substrate processed through the formation of n-type and p-type well regions (not shown). Alternatively, semiconductor body 8 may be an SOI substrate. Pad oxide 20 is a relatively thin layer of oxide, for example, on the order of 10 nm thick. A layer of pad nitride 22 is formed over pad oxide 20. Pad nitride 22 is typically much thicker than pad oxide 20 and may for example, be on the order of 100–200 nm thick.

Figure 2B:
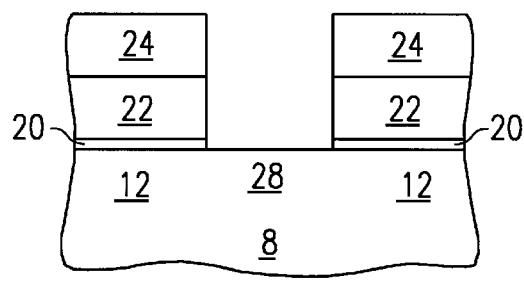

A resist pattern 24 is formed on pad nitride 22. Pattern 24 masks the areas of pad nitride 22 over active area locations 12 and exposes pad nitride 22 over isolation areas 28 where STI 10 is to be formed. Pad nitride 22 and pad oxide 20 are etched using resist pattern 24 as shown in FIG. 2B. Resist pattern 24 may then be removed. However, in the preferred embodiment, resist pattern 24 is not removed until later in the process flow.

Figure 2C:
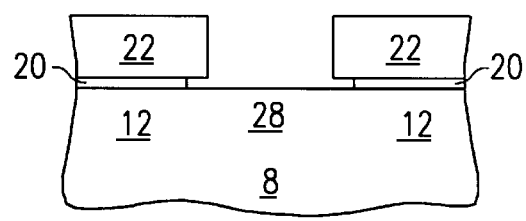

At this point, an oxide deglaze may be performed to undercut pad oxide 20 from pad nitride 22 as shown in FIG. 2C. Preferably, pad oxide 20 is undercut from pad nitride 22 a distance approximately equal to the thickness of pad oxide 20 (e.g., 10 nm). A range of 0.8 to 1.2 times the pad oxide 20 thickess is appropriate (e.g., 5–20 nm). A larger undercut provides a higher Vt at the corner and better gate oxide integrity, but also reduces the effective channel width of a device formed in active areas 12. The oxide deglaze is an isotropic or nearly isotropic etch so that the pad oxide 20 is undercut from pad nitride 22. Either a wet or plasma etch may be used. As an example, a 4.9 mole % solution of HF in water for a duration in the order of 20 seconds may be used. Alternatively, a 0.49% HF in water etch may be preferred with a longer etch time (i.e., on the order of 70 sec.) for better controlability. The duration of the etch may be adjusted to increase or decrease the amount of undercutting as desired.

Figure 2D:
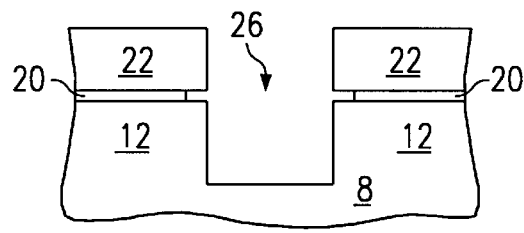

Referring to FIG. 2D, a trench 26 is etched into semiconductor body 8 using the pad nitride 22 and pad oxide 20 as a mask. Conventional methods for etching a trench may be used. The depth of trench 26 is not critical to the invention and may be chosen for conventional reasons such as degree of isolation desired. For example, trench 26 may have a depth on the order of 500 nm.

If desired, the oxide deglaze may be alternatively performed after the etch of trench 26. In this case, the removal of resist pattern 24 may be delayed until just before the oxide deglaze. In the preferred embodiment, the trench 26 is etched, then the resist pattern 24 is removed, and finally the pad oxide 20 is undercut. It should be noted that in the case where STI 10 is actually a SOI mesa isolation, delaying the oxide deglaze until after the trench etch may result in some loss of the buried oxide. Although the oxide deglaze may be performed either before or after the trench etch, it is performed prior to the sidewall oxidation of the trench.

Figure 2E:
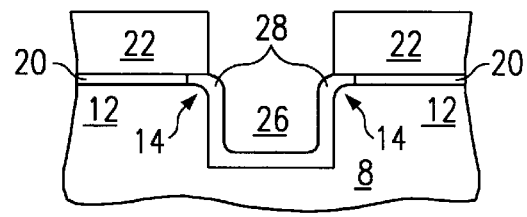

Referring to FIG. 2E, a sidewall oxide 28 is formed on the sidewalls of trench 26. Sidewall oxide 28 is a grown oxide and may have an average thickness on the order of 1.8 times the thickness of the pad oxide 20 (e.g. 180Å). Because pad oxide 20 is undercut from pad nitride 22, oxidation during the formation of sidewall oxide 28 causes a thicker oxide to be formed at upper corners 14 of trench 26. The formation of the thicker oxide, in turn, causes a rounding of the upper corners 14 of trench 26. This reduces the electric field strength at the corners and increases the Vt of a parasitic transistor inherent in the corner structure after the formation of active devices in active areas 12.

Methods for forming sidewall oxide 28 are known in the art. However, some methods for forming sidewall oxide 28 are currently being developed which further increase the rounding of the upper corners 14 of trench 26. The oxide deglaze of the invention may be combined with these methods for further corner rounding and improve results. For example, a halogenic oxidation may be used. Halogenic oxidation involves the addition of HCl to a dry O2 oxidation process. As an example, an O2/6% HCl chemistry may be used with a 900° C. furnace oxidation. The halogenic oxidation produces some corner rounding by itself. However, when combined with the oxide deglaze of the invention, the corner radius of curvature approximately doubles (from on the order of 14 nm to 29 nm). Alternatively, a rapid thermal oxidation may be used at temperatures on the order of 1050°–1100° C. A combined rapid thermal oxidation ate 1100° C. and 15 second deglaze has been shown to produce a corner radius of curvature on the order of 38 nm.

After the formation of sidewall oxide 28, a trench refill process is performed to fill trench 26 with a dielectric material, as shown in FIG. 1. Typically, the dielectric material is an oxide. For example, a TEOS refill process or an APCVD process may be used. The dielectric refill material is then densified for example at 950° C. for 30 minutes. Typically, the trench 26 is refilled to above a level of the pad nitride 22 and then CMPd to even with the nitride 22 then finally the nitride 22 is stripped.

Processing then continues with the formation of active devices (not shown) in active areas 12. Using STI 10 according to the invention, less surface area is required to isolate active areas 12 from each other. This allows further increases is density of the device. In addition, because of the corner rounding, less off-state current leakage occurs.

Figure 3:
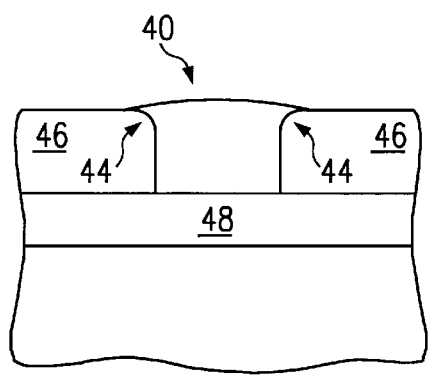
FIG. 3 is a cross-sectional diagram of mesa isolation according to the invention.

As mentioned above, the invention is equally applicable to mesa isolation in SOI devices. The usage of the terminology "trench" is meant to include that required in mesa isolation formation. FIG. 3 illustrates mesa isolation 40 formed according to the invention. Mesa isolation 40 also includes rounded upper corners 44. Rounded upper corners 44 are achieved using the oxide deglaze described above. In mesa isolation, the isolation 40 extends through the upper semiconductor layer 46 to the buried oxide layer 48.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming an isolation structure in a semiconductor body, comprising the steps of:

forming a pad oxide on said semiconductor body;

forming a pad nitride on said pad oxide;

patterning and etching said pad oxide and pad nitride to form a hard mask;

undercutting said pad oxide from said pad nitride using an oxide deglaze;

etching a trench in said semiconductor body using said hard mask;

oxidizing said semiconductor body in the presence of said hard mask to create a sidewall oxide, wherein said oxidizing step creates a thicker oxide at an upper corner of said trench rounding the upper corner of said trench; and filling said trench with a dielectric material.

2. The method of claim 1, wherein said undercutting step occurs prior to said etching a trench step.

3. The method of claim 1, wherein said undercutting step occurs after said etching a trench step and prior to said oxidizing step.

4. The method of claim 1, wherein said undercutting step undercuts said pad oxide from said pad nitride a distance approximately equal to the thickness of said pad oxide.

5. The method of claim 1, wherein said undercutting step undercuts said pad oxide from said pad nitride a distance on the order of 10 nm.

6. The method of claim 1, wherein said oxidizing step comprises oxidation at a temperature on the order of 900° C. in the presence of O2 and HCl.

7. The method of claim 6, wherein said HCl is used at a concentration on the order of 6%.

8. The method of claim 1, wherein said oxidizig step comprises a rapid thermal oxidation at a temperature on the order of 1100° C.

9. The method of claim 1, wherein said undercutting step comprises an oxide deglaze for a duration on the order of 70 seconds.

10. The method of claim 1, wherein said undercutting step comprises an oxide etch using a 0.49 mole % solution of HF in water.

11. The method of claim 1, wherein said semiconductor body comprises an SOI substrate and said isolation structure is a mesa isolation structure.

12. The method of claim 1, wherein said isolation structure is a shallow trench isolation structure.

13. A method of forming a shallow trench isolation structure in a semiconductor body, comprising the steps of:

forming a pad oxide on said semiconductor body;

forming a pad nitride on said pad oxide;

patterning and etching said pad nitride and pad oxide to form a hard mask;

etching a trench in said semiconductor body using said hard mask;

isotropically etching said pad oxide to undercut the pad oxide from said pad nitride a distance approximately equal to the thickness of said pad oxide;

oxidizing said semiconductor body to form a sidewall oxide in said trench, wherein the radius of curvature of an upper corner of said trench is increased during said oxidizing step due to said isotropically etching step; and filling said trench with a dielectric material.

14. The method of claim 13, wherein said isotropically etching step undercuts said pad oxide from said pad nitride a distance on the order of 10 nm.

15. The method of claim 13, wherein said oxidizing step comprises oxidation at a temperature on the order of 900° C. in the presence of O2 and HCl at a concentration on the order of 6%.

16. The method of claim 13, wherein said oxidizing step comprises a rapid thermal oxidation at a temperature on the order of 1100° C.

17. The method of claim 13, wherein said isotropically etching step comprises an oxide etch using an approximately 0.49 mole % solution of HF in water for a duration on the order of 70 seconds.

* * * * *

UNITED STATES PATENT AND TRADEMARK OFFICE
CERTIFICATE OF CORRECTION

PATENT NO.    : 5,863,827                                        Page 1 of 1
DATED         : January 26, 1999
INVENTOR(S)   : Keith Joyner It is certified that error appears in the above-identified patent and that said Letters Patent is hereby corrected as shown below:

<u>Title page,</u>
Item [57], ABSTRACT,
Line 1, change "(STJ)" to -- (STI) --.
Line 9, change "minimum" to -- minimize --.
Item [60], Continuing Data, add "-- Provisional Appl. No. 60/018,900 filed June 3, 1996. --

<u>Column 1,</u>
Line 3, after the title add -- This application claims priority under 35 USC § 119 (e) (1) of provisional application number 60/018,900 filed 06/03/96. --

Signed and Sealed this

First Day of April, 2003

JAMES E. ROGAN
*Director of the United States Patent and Trademark Office*